US009743519B2

(12) United States Patent
Takai et al.

(10) Patent No.: US 9,743,519 B2
(45) Date of Patent: Aug. 22, 2017

(54) HIGH-FREQUENCY COMPONENT AND HIGH-FREQUENCY MODULE INCLUDING THE SAME

(71) Applicant: Murata Manufacturing Co., Ltd., Nagaokakyo-shi, Kyoto-fu (JP)

(72) Inventors: Kiyofumi Takai, Nagaokakyo (JP); Hidenori Obiya, Nagaokakyo (JP); Shinya Hitomi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 46 days.

(21) Appl. No.: 14/883,792

(22) Filed: Oct. 15, 2015

(65) Prior Publication Data
US 2016/0037640 A1 Feb. 4, 2016

Related U.S. Application Data

(63) Continuation of application No. PCT/JP2014/056155, filed on Mar. 10, 2014.

(30) Foreign Application Priority Data

Apr. 16, 2013 (JP) ................................. 2013-085383

(51) Int. Cl.
H05K 1/18 (2006.01)
H05K 1/14 (2006.01)
(Continued)

(52) U.S. Cl.
CPC ............ H05K 1/147 (2013.01); H01L 23/12 (2013.01); H01L 23/13 (2013.01); H01L 23/293 (2013.01);
(Continued)

(58) Field of Classification Search
CPC ....... H01L 2924/01079; H01L 2224/16; H01L 25/0657; H01L 25/105;
(Continued)

(56) References Cited

U.S. PATENT DOCUMENTS 6,472,735 B2 * 10/2002 Isaak .................... H01L 25/0657
257/685
6,493,240 B2 * 12/2002 Broglia .................. H05K 1/141
361/736
(Continued)

FOREIGN PATENT DOCUMENTS

JP 2002-118486 A 4/2002
JP 2006-203652 A 8/2006
(Continued)

OTHER PUBLICATIONS

Official Communication issued in International Patent Application No. PCT/JP2014/056155, mailed on Jun. 10, 2014.

Primary Examiner — Tuan T Dinh
(74) Attorney, Agent, or Firm — Keating & Bennett, LLP

(57) ABSTRACT

A filter circuit component includes desired frequency characteristics without being influenced by a parasitic inductance and a parasitic capacitance, and since the ground terminal of the filter circuit component connected to the mounting electrode of the high-frequency component is connected to the ground electrode of the high-frequency component through the via conductors of the high-frequency component at the shortest distance, the packing density of the filter circuit component is significantly increased and the occurrence of an unnecessary parasitic inductance and an unnecessary parasitic capacitance is prevented. The filter circuit component is mounted on the high-frequency component to obtain the desired frequency characteristics without the influence of a parasitic inductance and a parasitic capacitance. Since the component is located in a space surrounded
(Continued)

by the inner peripheral surface of the supporting frame body, the packing density of components mounted on the high-frequency component is increased.

20 Claims, 3 Drawing Sheets

(51) Int. Cl.
*H01L 23/12* (2006.01)
*H01L 23/13* (2006.01)
*H01L 23/29* (2006.01)
*H01L 23/31* (2006.01)
*H01L 23/498* (2006.01)
*H05K 1/02* (2006.01)
*H05K 1/11* (2006.01)
*H01L 23/552* (2006.01)
*H01L 23/538* (2006.01)
*H01L 23/66* (2006.01)
*H01L 23/00* (2006.01)
*H01L 23/24* (2006.01)

(52) U.S. Cl.
CPC .... *H01L 23/3107* (2013.01); *H01L 23/49822* (2013.01); *H01L 23/49827* (2013.01); *H01L 23/49833* (2013.01); *H01L 23/5385* (2013.01); *H01L 23/552* (2013.01); *H05K 1/0298* (2013.01); *H05K 1/111* (2013.01); *H05K 1/18* (2013.01); *H01L 23/24* (2013.01); *H01L 23/5384* (2013.01); *H01L 23/66* (2013.01); *H01L 24/16* (2013.01); *H01L 24/29* (2013.01); *H01L 24/32* (2013.01); *H01L 24/73* (2013.01); *H01L 24/81* (2013.01); *H01L 2224/16227* (2013.01); *H01L 2224/291* (2013.01); *H01L 2224/32225* (2013.01); *H01L 2224/48091* (2013.01); *H01L 2224/48227* (2013.01); *H01L 2224/73253* (2013.01); *H01L 2224/81205* (2013.01); *H01L 2224/81801* (2013.01); *H01L 2924/14* (2013.01); *H01L 2924/1421* (2013.01); *H01L 2924/15153* (2013.01); *H01L 2924/15159* (2013.01); *H01L 2924/15311* (2013.01); *H01L 2924/15313* (2013.01); *H01L 2924/15787* (2013.01); *H01L 2924/15788* (2013.01); *H01L 2924/1631* (2013.01); *H01L 2924/16152* (2013.01); *H01L 2924/16251* (2013.01); *H01L 2924/181* (2013.01); *H01L 2924/19041* (2013.01); *H01L 2924/19042* (2013.01); *H01L 2924/19043* (2013.01); *H01L 2924/19105* (2013.01); *H05K 2201/042* (2013.01); *H05K 2201/10007* (2013.01); *H05K 2201/1053* (2013.01); *H05K 2201/10053* (2013.01); *H05K 2201/10098* (2013.01)

(58) Field of Classification Search
CPC ........ H05K 1/141–1/144; H05K 3/306; H05K 1/111; H05K 1/181
USPC .......... 361/767–795; 257/685–686, 728–730
See application file for complete search history.

(56) References Cited

U.S. PATENT DOCUMENTS

| | | | | |
|---|---|---|---|---|
| 8,208,270 | B2* | 6/2012 | Mori | B23K 1/0016 |
| | | | | 361/770 |
| 8,767,409 | B2* | 7/2014 | Cheng | H01L 23/552 |
| | | | | 361/763 |
| 8,823,158 | B2* | 9/2014 | Oh | H01L 25/105 |
| | | | | 257/686 |
| 9,167,686 | B2* | 10/2015 | Chen | H01L 23/3121 |
| 2004/0119560 | A1 | 6/2004 | Tsurunari et al. | |
| 2005/0260867 | A1* | 11/2005 | Ono | H05K 1/144 |
| | | | | 439/65 |
| 2009/0250801 | A1* | 10/2009 | Isa | H01G 4/35 |
| | | | | 257/686 |
| 2011/0317386 | A1* | 12/2011 | Kawabata | H05K 1/141 |
| | | | | 361/772 |

FOREIGN PATENT DOCUMENTS

| | | |
|---|---|---|
| JP | 2007-103750 A | 4/2007 |
| JP | 2007-129459 A | 5/2007 |

* cited by examiner

FIG. 1
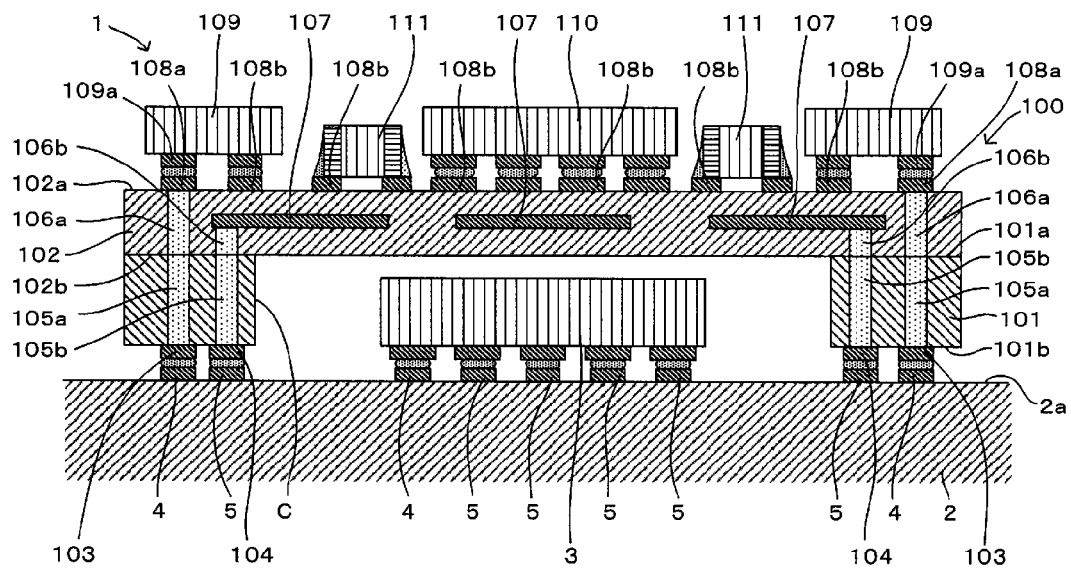
FIG. 2A
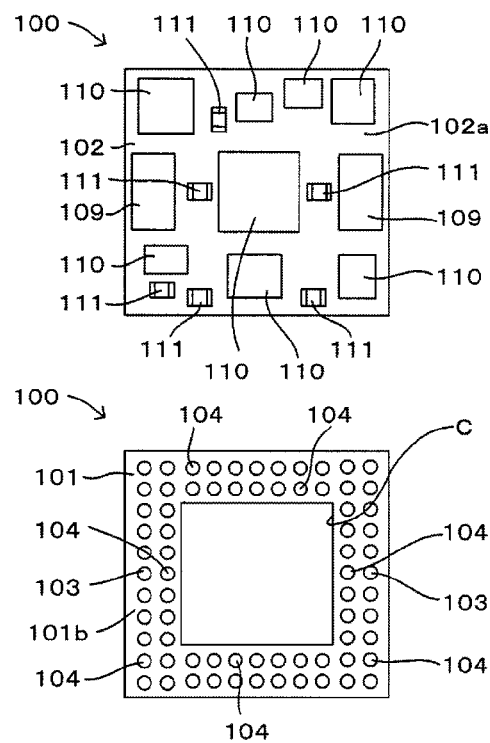
FIG. 2B

HIGH-FREQUENCY COMPONENT AND HIGH-FREQUENCY MODULE INCLUDING THE SAME

BACKGROUND OF THE INVENTION

1. Field of the Invention

The present invention relates to a high-frequency component including a filter circuit component and a high-frequency module including the high-frequency component.

2. Description of the Related Art

FIG. 5 illustrates a high-frequency component 500 in the related art. In the high-frequency component 500, a switch IC 502 and a filter circuit component 503 such as a surface acoustic wave (SAW) filter or a duplexer formed by a SAW filter are mounted on a ceramic multilayer substrate 501. On the multilayer substrate 501, a matching mount component 504 such as a chip capacitor or a chip inductor is disposed as needed. Wiring electrodes that include a plurality of in-plane electrodes 505 including a ground electrode and a plurality of via conductors 506 for performing interlayer connection between the in-plane electrodes 505 are disposed in the multilayer substrate 501. The components 502 to 504 mounted on the multilayer substrate 501 and mounting electrodes 507 used for external connection are electrically connected with the wiring electrodes interposed therebetween.

When the filter circuit component 503 is mounted on the multilayer substrate 501, the frequency characteristics of the filter circuit component 503 may be changed from a desired characteristic at design time owing to the parasitic inductance or parasitic capacitance of the wiring electrode in the multilayer substrate 501 connected to the filter circuit component 503. Accordingly, the filter circuit component 503 disposed in the high-frequency component 500 illustrated in FIG. 5 is designed based on the assumption that the frequency characteristics thereof are changed when being mounted on the multilayer substrate 501. That is, the frequency characteristic of the filter circuit component 503 is deviated from a desired characteristic so that the deviated characteristic is changed to the desired characteristic under the influence of the parasitic inductance or parasitic capacitance of a wiring electrode connected to the filter circuit component 503 when the filter circuit component 503 is mounted on the multilayer substrate 501.

In order to obtain the desired frequency characteristics of the filter circuit component 503 when the filter circuit component 503 is mounted on the multilayer substrate 501 in the high-frequency component 500, it is necessary for the wiring electrode in the multilayer substrate 501 to have a desired parasitic inductance or a desired parasitic capacitance. Thus, since the design of the high-frequency component 500 is limited, it is difficult to increase the packing density of components in the high-frequency component 500.

SUMMARY OF THE INVENTION

Preferred embodiments of the present invention provide a technique for mounting a filter circuit component so as to obtain desired frequency characteristics of the filter circuit component without receiving influence of a parasitic inductance and a parasitic capacitance, and to increase the packing density of components.

A high-frequency component according to a preferred embodiment of the present invention includes a supporting frame body having a frame shape, a substrate that has a shape that is the same or substantially the same as an outer shape of the supporting frame body and is laminated on one surface of the supporting frame body, a ground electrode provided on another surface of the supporting frame body, a mounting electrode that is provided on one main surface of the substrate so that the mounting electrode at least partly overlaps the ground electrode in plan view, an interlayer connection conductor that is disposed at a position where the ground electrode and the mounting electrode overlap, passes through the supporting frame body and the substrate in a lamination direction, and connects the ground electrode and the mounting electrode, and a filter circuit component that is mounted on the one main surface of the substrate and includes a ground terminal connected to the mounting electrode.

In a preferred embodiment of the present invention, the substrate is laminated on the one surface of the supporting frame body having a frame shape, the ground electrode is provided on the other surface of the supporting frame body, the mounting electrode is provided on the one main surface of the substrate so that the mounting electrode at least partly overlaps the ground electrode in plan view, and the interlayer connection conductor that passes through the supporting frame body and the substrate in the lamination direction is disposed at a position where the ground electrode and the mounting electrode overlap. The filter circuit component is mounted on the one main surface of the substrate with the ground terminal thereof connected to the mounting electrode connected to the ground electrode via the interlayer connection conductor at the shortest distance. Accordingly, the ground electrode is located directly below the filter circuit component, and the ground terminal of the filter circuit component connected to the mounting electrode is connected to the ground electrode via the interlayer connection conductor at the shortest distance.

Accordingly, the occurrence of an unnecessary parasitic inductance and an unnecessary parasitic capacitance at the mounting electrode, the interlayer connection conductor, and the ground electrode which are connected to the ground terminal of the filter circuit component is significantly reduced or prevented. It is therefore possible to mount the filter circuit component on a high-frequency component so as to obtain the desired frequency characteristics of the filter circuit component without receiving the influence of a parasitic inductance and a parasitic capacitance. Furthermore, since a component is able to be located in a space surrounded by the inner peripheral surface of the supporting frame body, the packing density of components is increased.

A component may be located in a space surrounded by an inner peripheral surface of the supporting frame body.

Since a component is located in a space surrounded by the inner peripheral surface of the supporting frame body, it is possible to provide a high-frequency component that achieves a high packing density of components.

The component may be any one of a power amplifier, a radio frequency integrated circuit (RF-IC), and a switch IC, for example.

A filter circuit component susceptible to a grounding state is well-grounded and is then mounted on the one main surface of the substrate. The component such as a power amplifier, an RF-IC, or a switch IC less susceptible to a grounding state is located in a space surrounded by the inner peripheral surface of the supporting frame body. As a result, the characteristic degradation of the high-frequency component due to the grounding state is significantly reduced or prevented, and the packing density of components is increased.

The component may be in contact with another main surface of the substrate.

In a case where the component is a heat-producing component, since the component is in contact with the other main surface of the substrate, the heat dissipation of the component through the substrate is improved.

The supporting frame body and the substrate may be defined by the same member.

Since the supporting frame body and the substrate are preferably defined by the same member, the occurrence of a stress due to the difference in thermal expansion coefficients at the connection between the supporting frame body and the substrate is prevented in a heating cycle such as reflowing. Since the isolation between the supporting frame body and the substrate due to, for example, a thermal stress is prevented, the reliability of the connection is improved in the high-frequency component. The supporting frame body and the substrate may be integrally formed and defined by a single unitary member. In this case, since the supporting frame body and the substrate are integrally formed and defined by a single unitary member, the reliability of the connection between them is further improved in the high-frequency component.

A high-frequency module according to a preferred embodiment of the present invention includes a high-frequency component according to any of the other preferred embodiments of the present invention and a module substrate on which the high-frequency component is mounted.

By disposing a high-frequency component so that it covers various components mounted on the module substrate, the packing density of components is increased in the high-frequency module including the high-frequency component. By covering the components with the supporting frame body and the substrate which are included in the high-frequency component, noise generated by the components is significantly reduced or prevented. By covering the components with the supporting frame body and the substrate which are included in the high-frequency component, the components are shielded from external noise and the influence of the noise on the components is significantly reduced or prevented.

According to various preferred embodiments of the present invention, the ground electrode is disposed directly below the filter circuit component and the ground terminal of the filter circuit component connected to the mounting electrode is connected to the ground electrode via the interlayer connection conductor at the shortest distance. Accordingly, the occurrence of an unnecessary parasitic inductance and an unnecessary parasitic capacitance at the mounting electrode, the interlayer connection conductor, and the ground electrode which are connected to the ground terminal of the filter circuit component is significantly reduced or prevented. It is therefore possible to mount the filter circuit component on the high-frequency component so as to obtain the desired frequency characteristics of the filter circuit component without receiving the influence of a parasitic inductance and a parasitic capacitance. Furthermore, since a component is able to be located in a space surrounded by the inner peripheral surface of the supporting frame body, the packing density of components is increased.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a cross-sectional view of a high-frequency module according to a first preferred embodiment of the present invention.

FIG. 2A is a plan view illustrating a high-frequency component, and FIG. 2B is a diagram illustrating the high-frequency component on an undersurface.

DETAILED DESCRIPTION OF THE PREFERRED EMBODIMENTS

First Preferred Embodiment

Figure 3:
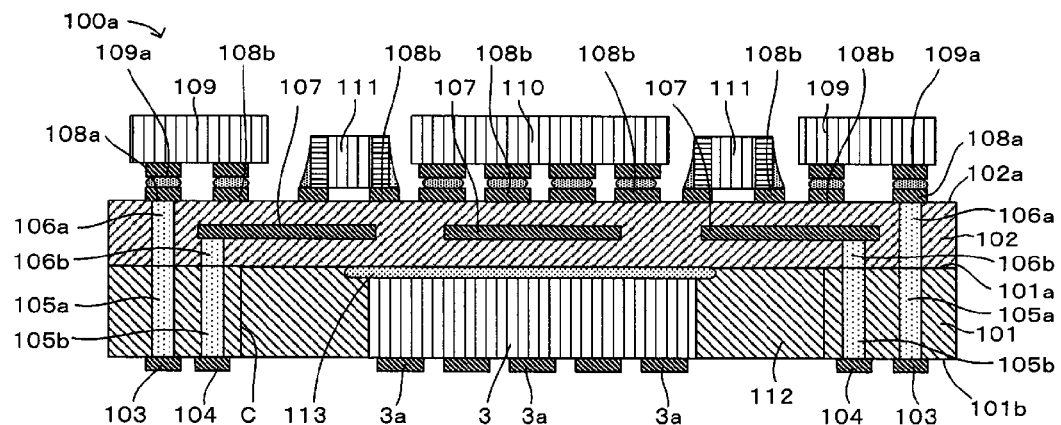
FIG. 3 is a diagram illustrating a high-frequency component disposed in a high-frequency module according to a second preferred embodiment of the present invention.

The first preferred embodiment of the present invention will be described with reference to FIGS. 1, 2A and 2B. FIG. 1 is a cross-sectional view of a high-frequency module according to the first preferred embodiment of the present invention. FIG. 2A is a plan view illustrating a high-frequency component, and FIG. 2B is a diagram illustrating the high-frequency component on an undersurface.

As illustrated in FIG. 1, a high-frequency module 1 includes a module substrate 2, a component 3 such as a power amplifier, a radio frequency integrated circuit (RFIC), or a switch IC mounted on the module substrate 2, and a high-frequency component 100 mounted on the module substrate 2. The high-frequency module 1 is mounted on a mount board in a communication mobile terminal such as a cellular phone or a personal digital assistant and defines and functions as an antenna switch module or a communication module such as a front-end module, a Bluetooth (registered trademark) module, or a wireless LAN module, for example.

In the module substrate 2, wiring electrodes (not illustrated) including in-plane electrodes and via conductors used for interlayer connection are provided. The wiring electrode is connected to a ground land electrode 4 and a signal land electrode 5 which are provided on a mounting surface 2a of the module substrate 2. The module substrate 2 is preferably made of a commonly-used substrate forming material, for example, a resin material such as a glass epoxy resin or a liquid crystal polymer or a ceramic material. The wiring electrodes are preferably made of a conductive material made of Ag, Cu, or Au. Various electrical circuits may be provided in the module substrate 2 with the wiring electrodes.

The component 3 is disposed on the land electrodes 4 and 5 at predetermined positions on the mounting surface 2a of the module substrate 2 by bonding using a binder such as solder or a conductive adhesive, ultrasonic vibration bonding, or bonding using a surface activation technique (hereinafter referred to as "by soldering or the like"), and is provided in a cavity C in the lower portion of the high-frequency component 100. In this preferred embodiment, any one of a power amplifier, an RF-IC, and a switch IC is placed as the component 3 in the cavity C in the high-frequency component 100 in accordance with the intended use of the high-frequency module 1. However, another component may be provided in the cavity C as appropriate.

The high-frequency component 100 includes a supporting frame body 101 having a frame shape and a substrate 102 that has the same or substantially the same outer rectangular shape as the supporting frame body 101 and is provided on one surface 101a of the supporting frame body 101, and is mounted on the land electrodes 4 and 5 located at predetermined positions on the module substrate 2 by soldering or the like. The supporting frame body 101 is preferably made of a commonly-used substrate forming thermosetting resin such as an epoxy resin, is disposed so that the outer periphery of the frame shape of the supporting frame body 101 and the outer shape of the substrate 102 are aligned, and has the one surface 101a bonded to another main surface 102b of the substrate 102.

On another surface 101b of the supporting frame body 101, a ground electrode 103 and a signal electrode 104 are provided. The ground electrode 103 and the signal electrode 104 are connected to the land electrodes 4 and 5, respectively, located at predetermined positions on the mounting surface 2a of the module substrate 2 by soldering or the like. In the supporting frame body 101, a plurality of columnar via conductors 105a and a plurality of columnar via conductors 105b, which are metal (Cu, Al, Au, or Ag, for example) portions, are disposed along the circumferential direction of the frame shape. One end of each of the via conductors 105a and 105b is exposed on the one surface 101a of the substrate 101, and the other end of the via conductor is connected to the ground electrode 103 or the signal electrode 104 provided on the other surface 101b of the supporting frame body 101.

In this preferred embodiment, the substrate 102 preferably is a multilayer ceramic substrate obtained by laminating and firing a plurality of ceramic green sheets. The ceramic green sheet is obtained by forming slurry containing the mixture of mixed powder of alumina and glass, an organic binder, and a solvent into a sheet. In each ceramic green sheet, via holes are formed by, for example, laser processing at predetermined positions, and the via holes are filled with a conductive paste containing, for example, Ag or Cu, so that via conductors 106a and 106b used for interlayer connection are formed. Furthermore, by performing printing with the conductive paste, various in-plane electrodes 107 are formed. Subsequently, by laminating and pressure bonding the ceramic green sheets, a ceramic multilayer body is formed. By firing the ceramic multilayer body at low temperatures of approximately 1000° C., for example, the substrate 102 is formed.

On one main surface 102a of the substrate 102, mounting electrodes 108a and 108b used for the mounting of various components are provided. The mounting electrode 108a is provided on the one main surface 102a of the substrate 102 so that the mounting electrode 108a at least partly overlaps the ground electrode 103 on the other surface 101b of the supporting frame body 101 in plan view. The via conductors 105a and 106a are disposed at a position where the ground electrode 103 and the mounting electrode 108a overlap. One end of the via conductor 106a is connected to the mounting electrode 108a, and the other end of the via conductor 106a is connected to one end of the via conductor 105a, so that the ground electrode 103 and the mounting electrode 108a are connected. Thus, an "interlayer connection conductor" that passes through the supporting frame body 101 and the substrate 102 in a lamination direction with the via conductors 105a and 106a is provided.

One end of the via conductor 105b in the supporting frame body 101 is connected to the other end of the via conductor 106b in the substrate 102, and one end of the via conductor 106b is connected to the in-plane electrode 107, so that the signal electrode 104 on the other surface 101b of the supporting frame body 101 and the mounting electrode 108b on the one main surface 102a of the substrate 102 are connected with the in-plane electrode 107 interposed therebetween.

A filter circuit component 109 is mounted on the mounting electrodes 108a and 108b in the peripheral portion of the one main surface 102a of the substrate 102 by soldering or the like with a ground terminal 109a thereof connected to the mounting electrode 108a connected to the ground electrode 103. The filter circuit component 109 may be any component such as a SAW filter, a duplexer including a plurality of SAW filters, or a ceramic device defining an LC filter, for example. The one main surface 102a of the substrate 102 may be sealed with an insulating resin.

On the other mounting electrodes 108a and 108b, components 110 including the other filter circuit components and various ICs and various chip components 111 such as a resistor, an inductor, and a capacitor may be mounted in accordance with the intended use of the high-frequency module 1 (the high-frequency component 100). In a region around the center of the substrate 102, components 110 and 111 are preferably disposed which are less susceptible to parasitic components such as a parasitic inductance and a parasitic capacitance generated in accordance with a grounding state. As described above, after the component 3 has been mounted on the mounting surface 2a of the module substrate 2, the high-frequency component 100 is mounted on the mounting surface 2a of the module substrate 2. As a result, in a space in the cavity C surrounded by the inner peripheral surface of the supporting frame body 101, the component 3 mounted on the mounting surface 2a of the module substrate 2 is located.

The substrate 102 may be a printed substrate made of a resin or a polymer material, a ceramic substrate made of, for example, alumina, a glass substrate, a composite material substrate, a single-layer substrate, or a multilayer substrate. For the substrate 102, an optimum material may be selected as appropriate in accordance with the intended use of the high-frequency component 100.

An exemplary method of manufacturing the high-frequency component 100 will be described.

First, the substrate 102 having the above-described structure is prepared. The other end surfaces of the via conductors 106a and 106b which are exposed on the other main surface 102b of the substrate 102 are connected to one end surfaces of rod-shaped metal conductors made of, for example, Cu defining the via conductors 105a and 105b, respectively, by soldering or the like. Subsequently, a frame is placed on the other main surface 102b of the substrate 102 so that only the peripheral portion of the other main surface 102b of the substrate 102 is filled with a resin.

Subsequently, the frame is filled with a thermosetting resin such as an epoxy resin so that the rod-shaped metal conductors are covered. The surface of the resin formed into the shape of a frame in the peripheral portion of the other main surface 102b of the substrate 102 is, for example, ground, so that the ground electrode 103 and the signal electrode 104 are formed on the other end surfaces of the rod-shaped metal conductors exposed on the surface of the resin. As a result, the supporting frame body 101 having a frame shape is formed on the other main surface 102b of the substrate 102.

Subsequently, each of the components 109 to 111 is mounted on corresponding one of the mounting electrodes 108a and 108b on the one main surface 102a of the substrate 102. As a result, the high-frequency component 100 is completed.

The via conductors 105a and 105b in the supporting frame body 101 may be formed by forming through-holes to be connected to the via conductors 106a and 106b in a frame-shaped resin layer in the peripheral portion of the other main surface 102b of the substrate 102 and filling the through-holes with a conductive paste. Alternatively, after the rod-shaped via conductors 105a and 105b have been formed on the other end surfaces of the via conductors 106a and 106b, respectively, exposed on the other main surface 102b of the substrate 102 by plating growth, a frame may be placed on the other main surface 102b of the substrate 102 so that only the peripheral portion of the other main surface 102b is filled with a resin. The frame may be filled with a thermosetting resin such as an epoxy resin so that the rod-shaped metal conductors are covered. In addition, a resin layer may be provided so that the resin layer covers the one main surface 102a of the substrate 102 and the components 109 to 111.

Thus, in this preferred embodiment, the substrate 102 is laminated on the one surface 101a of the supporting frame body 101 having a frame shape. The ground electrode 103 is formed on the other surface 101b of the supporting frame body 101. The mounting electrode 108a is formed on the one main surface 102a of the substrate 102 so that the mounting electrode 108a at least partly overlaps the ground electrode 103 in plan view. An interlayer connection conductor that includes the via conductors 105a and 106a and passes through the supporting frame body 101 and the substrate 102 in the lamination direction is provided at a position where the ground electrode 103 and the mounting electrode 108a overlap.

The filter circuit component 109 is mounted on the one main surface 102a of the substrate 102 with the ground terminal 109a thereof connected to the mounting electrode 108a connected to the ground electrode 103 through the via conductors 105a and 106a at the shortest distance. That is, a route between the ground terminal 109a of the filter circuit component 109 and the ground electrode 103 is formed without using an unnecessary wiring pattern, and the ground terminal 109a of the filter circuit component 109 and the ground electrode 103 are directly connected with the mounting electrode 108a and the via electrodes 105a and 106a interposed therebetween. Accordingly, the ground electrode 103 is located directly below the filter circuit component 109, and the ground terminal 109a of the filter circuit component 109 connected to the mounting electrode 108a is connected to the ground electrode 103 through the via conductors 105a and 106a at the shortest distance.

Since the occurrence of an unnecessary parasitic inductance and an unnecessary parasitic capacitance at the mounting electrode 108a, the via conductors 105a and 106a, and the ground electrode 103 which are connected to the ground terminal 109a of the filter circuit component 109 is significantly reduced or prevented and the influence on the filter circuit component 109 is significantly reduced or prevented, it is possible to mount the filter circuit component 109 on the high-frequency component 100 so as to obtain the desired frequency characteristics of the filter circuit component 109 without receiving the influence of a parasitic inductance and a parasitic capacitance. As a result, since a parasitic component having an influence on the filter circuit component 109 is significantly reduced or prevented, the characteristics of the high-frequency module 1 are improved. Since the component 3 is able to be located in a space in the cavity C surrounded by the inner peripheral surface of the supporting frame body 101, the packing density of components in the high-frequency module 1 is significantly increased. That is, since a component is located in a space in the cavity C surrounded by the inner peripheral surface of the supporting frame body 101, it is possible to provide the high-frequency module 1 with a high packing density of components.

The filter circuit component 109 susceptible to parasitic components such as a parasitic inductance and a parasitic capacitance, which occur in accordance with a grounding state, is well-grounded and is then mounted on the one main surface 102a of the substrate 102. The component 3 such as a power amplifier, an RF-IC, or a switch IC less susceptible to parasitic components such as a parasitic inductance and a parasitic capacitance, which occur in accordance with a grounding state, is located in a space surrounded by the inner peripheral surface of the supporting frame body 10. As a result, the characteristic degradation of the high-frequency component 100 due to the grounding state is significantly reduced or prevented and the packing density of components in the high-frequency module 1 is increased.

The high-frequency component 100 is disposed so that it covers the component 3 mounted on the module substrate 2. As a result, noise generated by the component 3 is blocked by the high-frequency component 100. Thus, the leakage of noise is significantly reduced or prevented.

As illustrated in FIG. 2B, the ground electrodes 103 and the signal electrodes 104 are located along the entire outer periphery of the other surface 101b of the frame-shaped supporting frame body. Since the high-frequency component 100 is connected to the ground land electrodes 4 and the signal land electrodes 5 on the module substrate 2 along the entire peripheral portion thereof in plan view, the strength of the connection of the high-frequency component 100 to the module substrate 2 is increased.

The supporting frame body 101 may include a ceramic substrate or a resin substrate independently of the substrate 102. In this case, the supporting frame body 101 and the substrate 102 are laminated so that the other main surface 102b of the substrate 102 is bonded to the one surface 101a of the supporting frame body 101.

By forming the supporting frame body 101 and the substrate 102 with the same member, the following effects are obtained. That is, since the supporting frame body 101 and the substrate 102 are formed with the same member, the occurrence of a stress or the like due to the difference in thermal expansion coefficients at the connection between the supporting frame body 101 and the substrate 102 is prevented in a heating cycle such as reflowing. Since the isolation between the supporting frame body 101 and the substrate 102 due to, for example, a thermal stress is prevented, the reliability of the connection between them is greatly improved in the high-frequency component 100.

Second Preferred Embodiment

The second preferred embodiment of the present invention will be described with reference to FIG. 3. FIG. 3 is a diagram illustrating a high-frequency component disposed in a high-frequency module according to the second preferred embodiment of the present invention.

The high-frequency component 100a according to this preferred embodiment differs from the high-frequency component 100 according to the first preferred embodiment in that, as illustrated in FIG. 3, the component 3 is located in the cavity C and the cavity C is filled with a commonly-used molding resin 112 such as an epoxy resin. The component 3 is disposed in contact with the substrate 102 with a shielding member 113 formed of a metal material with an excellent conductivity such as solder or a conductive paste interposed therebetween. The other configuration is the same as that according to the first preferred embodiment, and the same reference numeral is used to represent the same component or the same portion so as to avoid repeated explanation.

As illustrated in FIG. 3, after the component 3 has been brought into contact with the substrate 102 with the shielding member 113 interposed therebetween in the cavity C, the cavity C is filled with the resin 112 so that a connection terminal 3a of the component 3 is exposed on the surface of the resin 112. Thus, the high-frequency component 100a is completed. The connection terminal 3a exposed on the surface of the resin 112, along with the ground electrode 103 and the signal electrode 104, is connected to the ground land electrode 4 and the signal land electrode 5 on the mounting surface 2a of the module substrate 2 by soldering or the like.

In this preferred embodiment, in addition to effects similar to those of the above-described preferred embodiment, the following effects are obtained. That is, since the component is provided in the cavity C, it is possible to provide the high-frequency component 100 having a high packing density of components. In a case where the component 3 that is in contact with the substrate 102 with the shielding member 113 interposed therebetween is a heat-producing component, the heat dissipation of the component 3 through the substrate 102 is improved. The shielding member 113 more effectively shields space in the cavity C.

By grounding the shielding member 113 with a heat dissipation via or the like (not illustrated), the above-described effect is increased. The shielding member 113 does not necessarily have to be provided. By bringing the component 3 into contact with the other main surface 102b of the substrate 102, the heat dissipation of the component 3 is improved. The cavity C may be filled with the resin 112 after the component 3 has been mounted on the other main surface 102b of the substrate 102.

Third Preferred Embodiment

Figure 4:
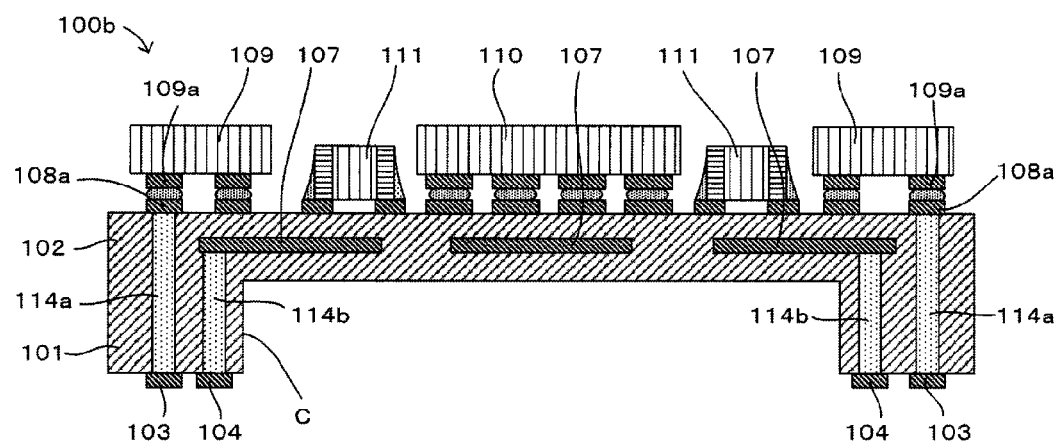
FIG. 4 is a diagram illustrating a high-frequency component disposed in a high-frequency module according to a third preferred embodiment of the present invention.
Figure 5:
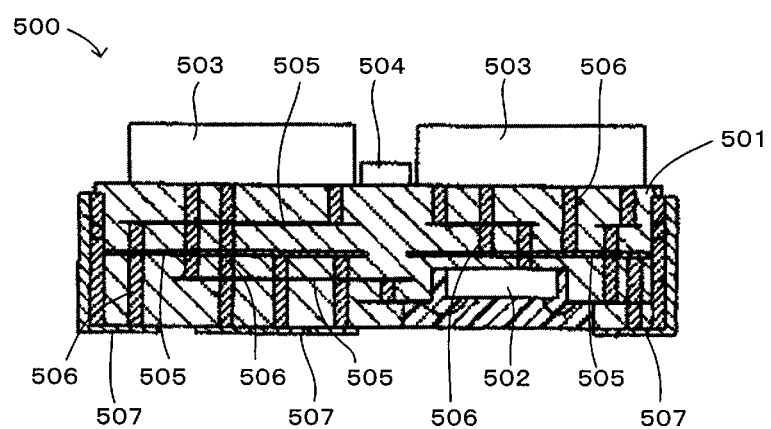
FIG. 5 is a diagram illustrating a high-frequency component in the related art.

The third preferred embodiment of the present invention will be described with reference to FIG. 4. FIG. 4 is a diagram illustrating a high-frequency component disposed in a high-frequency module according to the third preferred embodiment of the present invention.

A high-frequency component 100b according to this preferred embodiment differs from the high-frequency component 100 according to the first preferred embodiment in that the supporting frame body 101 and the substrate 102 are integrally formed to be defined by the same unitary member such as a ceramic material or a resin material and are laminated as illustrated in FIG. 4. The other configuration is the same as that according to the first preferred embodiment, and the same reference numeral is used to represent the same element or the same portion so as to avoid repeated explanation.

As illustrated in FIG. 4, in this preferred embodiment, a via conductor 114a (corresponding to an "interlayer connection conductor") that passes through the supporting frame body 101 and the substrate 102 and directly connects the ground electrode 103 and the mounting electrode 108a and a via conductor 114b that connects the signal electrode 104 and the in-plane electrode 107 are provided in the high-frequency component 100b. For example, the high-frequency component 100b is preferably formed as follows. A multilayer body corresponding to the supporting frame body 101 is obtained by laminating a plurality of ceramic green sheets having openings used for the formation of the cavity C. A multilayer body corresponding to the substrate 102 is obtained by laminating a plurality of ceramic green sheets. These multilayer bodies are laminated and fired, so that the high-frequency component 100b in which the supporting frame body 101 and the substrate 102 are integrally formed is formed.

In this preferred embodiment, in addition to effects similar to those of the above-described preferred embodiments, the following effects are obtained. That is, by integrally forming the supporting frame body 101 and the substrate 102 to be defined by the same unitary member, the occurrence of a stress or the like due to the difference in thermal expansion coefficients at the connection between the supporting frame body 101 and the substrate 102 is prevented reliably in a heating cycle such as reflowing. Accordingly, the reliability of the connection between them is further improved in the high-frequency component 100b.

The present invention is not limited to the above-described preferred embodiments. Various changes can be made to these preferred embodiments without departing from the scope of the present invention. For example, the shape of an inner circumference of the supporting frame body 101 in plan view, which is similar to the outer shape of the supporting frame body 101 in the above-described preferred embodiments, may be changed to an elliptical shape, a circular shape, a polygonal shape, or the like as appropriate.

Various preferred embodiments of the present invention can be widely applied to a high-frequency component including a filter circuit component and a high-frequency module including the high-frequency component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency component comprising:
a supporting frame body having a frame shape;
a substrate that has a same shape or substantially the same shape as an outer shape of the supporting frame body and is laminated on one surface of the supporting frame body;
a ground electrode located on another surface of the supporting frame body;
a mounting electrode provided on one main surface of the substrate so that the mounting electrode at least partly overlaps the ground electrode in plan view;
an interlayer connection conductor that is disposed at a position where the ground electrode and the mounting electrode overlap, passes through the supporting frame body and the substrate in a lamination direction, and connects the ground electrode and the mounting electrode; and
a filter circuit component that is mounted on the one main surface of the substrate and includes a ground terminal connected to the mounting electrode.

2. The high-frequency component according to claim 1, wherein a component is located in a space surrounded by an inner peripheral surface of the supporting frame body.

3. The high-frequency component according to claim 2, wherein the component is one of a power amplifier, a radio frequency integrated circuit, and a switch integrated circuit.

4. The high-frequency component according to claim 2, wherein the component is in contact with another main surface of the substrate.

5. The high-frequency component according to claim 1, wherein the supporting frame body and the substrate are defined by a same member.

6. The high-frequency component according to claim 1, wherein the component is located in a cavity in the supporting frame body.

7. The high-frequency component according to claim 1, wherein the interlayer connection conductor is a columnar via conductor including a metal material.

8. The high-frequency component according to claim 1, wherein the substrate is a multilayer ceramic substrate.

9. The high-frequency component according to claim 1, wherein the filter circuit component is one of a surface acoustic wave filter, a duplexer, and an LC filter.

10. The high-frequency component according to claim 1, further comprising a resin that seals the one main surface of the substrate.

11. The high-frequency component according to claim 1, wherein the supporting frame body and the substrate are made of one of resin and ceramic.

12. The high-frequency component according to claim 6, further comprising resin that fills the cavity.

13. The high-frequency component according to claim 1, further comprising a shielding member arranged such that the component is disposed in contact with the substrate with the shielding member.

14. A high-frequency module comprising:
the high-frequency component according to claim 1; and
a module substrate on which the high-frequency component is mounted.

15. A communication terminal comprising the high-frequency component according to claim 1.

16. The communication terminal according to claim 15, wherein the communication terminal is one of a cellular phone and a personal digital assistant.

17. The communication terminal according to claim 15, wherein the high-frequency component is included in one of an antenna switch module and a communication module of the communication terminal.

18. A communication terminal comprising the high-frequency module according to claim 14.

19. The communication terminal according to claim 18, wherein the communication terminal is one of a cellular phone and a personal digital assistant.

20. The communication terminal according to claim 15, wherein the high-frequency module is one of an antenna switch module and a communication module.

* * * * *